United States Patent
Fang et al.

(10) Patent No.: US 9,397,011 B1
(45) Date of Patent: Jul. 19, 2016

(54) SYSTEMS AND METHODS FOR REDUCING COPPER CONTAMINATION DUE TO SUBSTRATE PROCESSING CHAMBERS WITH COMPONENTS MADE OF ALLOYS INCLUDING COPPER

(71) Applicant: Lam Research Corporation, Fremont, CA (US)

(72) Inventors: Haoquan Fang, Sunnyvale, CA (US); Yuk-Hong Ting, Fremont, CA (US); David Cheung, Foster City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/684,870

(22) Filed: Apr. 13, 2015

(51) Int. Cl.
| | |
|---|---|
| *H01L 21/66* | (2006.01) |
| *H01J 37/32* | (2006.01) |
| *C23C 16/50* | (2006.01) |
| *C23C 16/455* | (2006.01) |
| *H01L 21/285* | (2006.01) |
| *H01L 21/3213* | (2006.01) |
| *H01L 21/027* | (2006.01) |
| *H01L 21/3105* | (2006.01) |
| *H01L 21/311* | (2006.01) |
| *H01L 21/3065* | (2006.01) |
| *H01L 21/02* | (2006.01) |
| *H01L 21/67* | (2006.01) |

(52) U.S. Cl.
CPC .......... *H01L 22/10* (2013.01); *C23C 16/45544* (2013.01); *C23C 16/50* (2013.01); *H01J 37/32009* (2013.01); *H01J 37/32449* (2013.01); *H01L 21/0262* (2013.01); *H01L 21/0273* (2013.01); *H01L 21/02274* (2013.01); *H01L 21/28556* (2013.01); *H01L 21/3065* (2013.01); *H01L 21/31058* (2013.01); *H01L 21/31116* (2013.01); *H01L 21/31138* (2013.01); *H01L 21/32136* (2013.01); *H01L 21/67253* (2013.01)

(58) Field of Classification Search
CPC ................... H01L 21/76864; H01L 21/76861
See application file for complete search history.

(56) References Cited

U.S. PATENT DOCUMENTS 7,084,070 B1 * 8/2006 Lee ................... H01L 21/31111
134/1.1

OTHER PUBLICATIONS

Zakharov et al.; AVS 58th Annual International Symposium and Exhibition, Paper PS-ThP1, "Anomalous Copper Contamination Observed During Hydrogen Plasma Processing", Nov. 3, 2011, 1 page.

* cited by examiner

*Primary Examiner* — Mohammad Choudhry

(57) ABSTRACT

Systems and methods for reducing copper contamination in a substrate processing system include performing a plasma process on a substrate in a processing chamber of a substrate processing system. A component is located in the processing chamber and is made of an alloy including copper. The plasma process uses a process gas mixture including molecular hydrogen. Prior to performing the plasma process on the substrate and before the substrate is arranged in the processing chamber, the component is conditioned in the processing chamber using a conditioning plasma process that includes a process gas mixture including molecular oxygen and forming gas.

20 Claims, 3 Drawing Sheets

SYSTEMS AND METHODS FOR REDUCING COPPER CONTAMINATION DUE TO SUBSTRATE PROCESSING CHAMBERS WITH COMPONENTS MADE OF ALLOYS INCLUDING COPPER

FIELD

The present disclosure relates to substrate processing systems, and more particularly to systems and methods for reducing copper contamination in substrate processing chambers with components made of alloys including copper.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Metal contamination of substrates such as semiconductor wafers leads to degradation of device performance and yield loss. The International Technology Roadmap for Semiconductors (ITRS) maintains a forecast of technology requirements for semiconductor processing including guidelines on acceptable metal contamination levels of semiconductor wafers. As feature sizes continue to decrease, the acceptable level of metal contamination also decreases.

Forming gas (FG) is commonly used as a process gas during plasma processing such as photoresist stripping. Forming gas includes 4% molecular hydrogen and 96% molecular nitrogen. Forming gas tends to generate excessive concentrations of copper during plasma processes in substrate processing chambers that include components made from alloys including copper. For example only, 6061 aluminum alloy includes 95.85% to 98.56% aluminum, 0.15% to 0.40% copper and other metals. 6061 aluminum alloy is widely used to manufacture components in the processing chamber that are exposed to plasma. When 6061 aluminum alloy is located in a plasma processing chamber where forming gas is used as the process gas, copper in the aluminum alloy may react with process gas and become volatile and may transport to and contaminate the substrates.

One approach for reducing copper contamination involves plasma conditioning of the substrate processing chamber. The plasma conditioning generally requires one or more weeks to perform and generates inconsistent results. Another approach is to manufacture the processing chamber components using metals that do not include copper. This approach may increase the cost of the substrate processing tool and may increase the risk of a performance shift that may generate other issues.

SUMMARY

A method for reducing copper contamination in a substrate processing system includes performing a plasma process on a substrate in a processing chamber of a substrate processing system. A component located in the processing chamber is made of an alloy including copper. The plasma process uses a process gas mixture including molecular hydrogen. Prior to performing the plasma process on the substrate and before the substrate is arranged in the processing chamber, the method includes conditioning the component in the processing chamber using a conditioning plasma process that includes a process gas mixture including molecular oxygen and forming gas.

In other features, the alloy includes aluminum. The alloy comprises 6061 aluminum alloy. The process gas mixture includes forming gas. The forming gas includes 4% molecular hydrogen and 96% molecular nitrogen.

In other features, the method includes arranging a dummy substrate on a substrate support in the processing chamber during the conditioning plasma process.

In other features, the substrate includes a semiconductor wafer. The plasma process includes a photoresist strip process.

In other features, copper contamination in the processing chamber before the conditioning plasma process as compared to copper contamination after the conditioning plasma process is reduced by a factor of 10.

In other features, the conditioning plasma process includes N plasma processing cycles each including a plasma ON time, and wherein N is an integer greater than one.

A substrate processing system includes a processing chamber. A component located in the processing chamber is made of an alloy including copper. A plasma generator is configured to generate plasma in the processing chamber. A gas delivery system is configured to selectively deliver forming gas, molecular oxygen and/or molecular hydrogen to the processing chamber. A controller communicates with the gas delivery system and the plasma generator. The controller is configured to, prior to performing a plasma process on a substrate in the processing chamber using a process gas mixture including molecular hydrogen and before the substrate is arranged in the processing chamber, condition the component in the processing chamber using a conditioning plasma process that includes a process gas mixture including the molecular oxygen and the forming gas. The controller is further configured to perform the plasma process on the substrate.

In other features, the alloy includes aluminum. The alloy comprises 6061 aluminum alloy. The process gas mixture includes forming gas. The forming gas includes 4% molecular hydrogen and 96% molecular nitrogen. A dummy substrate is arranged on a substrate support in the processing chamber during the conditioning plasma process. The substrate includes a semiconductor wafer. The plasma process includes a photoresist strip process.

In other features, copper contamination in the processing chamber before the conditioning plasma process as compared to copper contamination after the conditioning plasma process is reduced by a factor of 10.

In other features, the conditioning plasma process includes N plasma processing cycles each including a plasma ON time, and wherein N is an integer greater than one.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure condition a substrate processing chamber prior to plasma processing using hydrogen-based plasma to reduce copper contamination due to the presence of components made from alloys including copper. In some examples, the hydrogen-based plasma includes forming gas. Consistent results can be achieved in a few hours rather than one or more weeks needed for conventional conditioning processes.

The systems and methods described herein expose the components made from alloys including copper to plasma cycles using a conditioning gas mixture including molecular oxygen and forming gas (FG). During the conditioning process, production substrates are not located in the processing chamber. However, dummy substrates may be used to protect the substrate support. In some examples, a ratio of molecular oxygen to forming gas is 3:2, although other ratios can be used. The systems and methods described herein can be used to condition components in new chambers, used chambers with new components or in used chambers that were previously processed with different gas chemistries.

Figure 1:
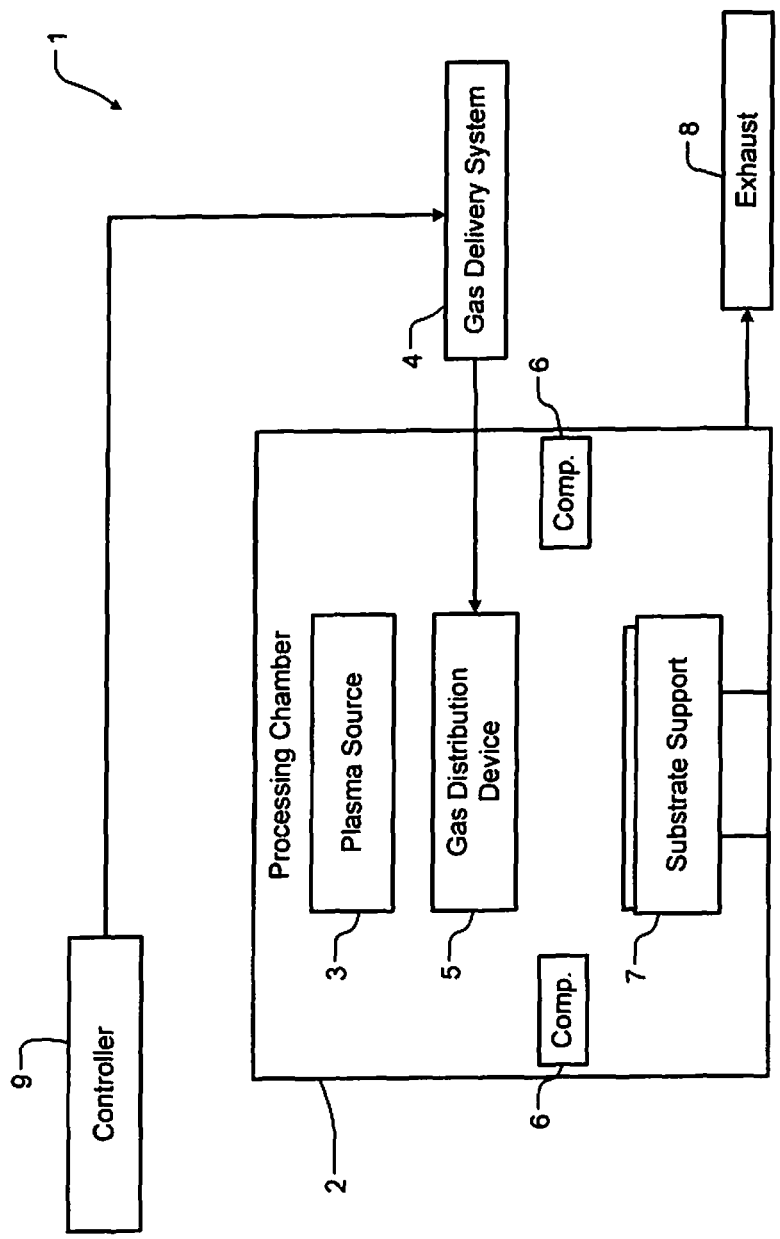
FIG. 1 is a functional block diagram of an example of a plasma-based substrate processing system that uses forming gas and has reduced copper contamination according to the present disclosure.

Referring now to FIG. 1, a substrate processing system 1 includes a processing chamber 2 with a plasma source 3 that may be direct or remote (not shown). The substrate processing system 1 further includes a gas delivery system 4 that selectively delivers the conditioning gas, process gas and/or purge gas to a gas distribution device 5 in the processing chamber 2. The processing chamber 2 further includes one or more components 6 that are arranged in the processing chamber 2 and that are made from alloys including copper. The processing chamber 2 further includes a substrate support 7 such as a pedestal, a chuck, etc. upon which a substrate is positioned during processing. An exhaust system 8 removes reactants and etch byproducts from the processing chamber 2.

A controller 9 communicates with and controls the plasma source 3 and the gas delivery system 4 during operation. During a chamber conditioning process, the controller 9 is configured to supply the conditioning gas mixture of molecular oxygen and forming gas during plasma cycles. One or more dummy substrates may be arranged on the substrate support 7 during the plasma cycles. After a predetermined number of plasma cycles are performed, the components 6 are conditioned and will cause significantly less copper contamination of production substrates treated during subsequent plasma processing using hydrogen-based plasma. In some examples, the duration, RF power used during conditioning is approximately the same as or similar to the duration, RF power used during the subsequent processing of the substrates.

While specific substrate processing systems for performing a photoresist strip process using a remote plasma source will be described further herein, other types of plasma-based processing chambers that use hydrogen-based plasma and that employ components made from alloys including copper may be used. Examples of other substrate processing systems include plasma-enhanced chemical vapor deposition (PECVD) and plasma-enhanced atomic layer deposition (PEALD) processing tools.

Figure 2:
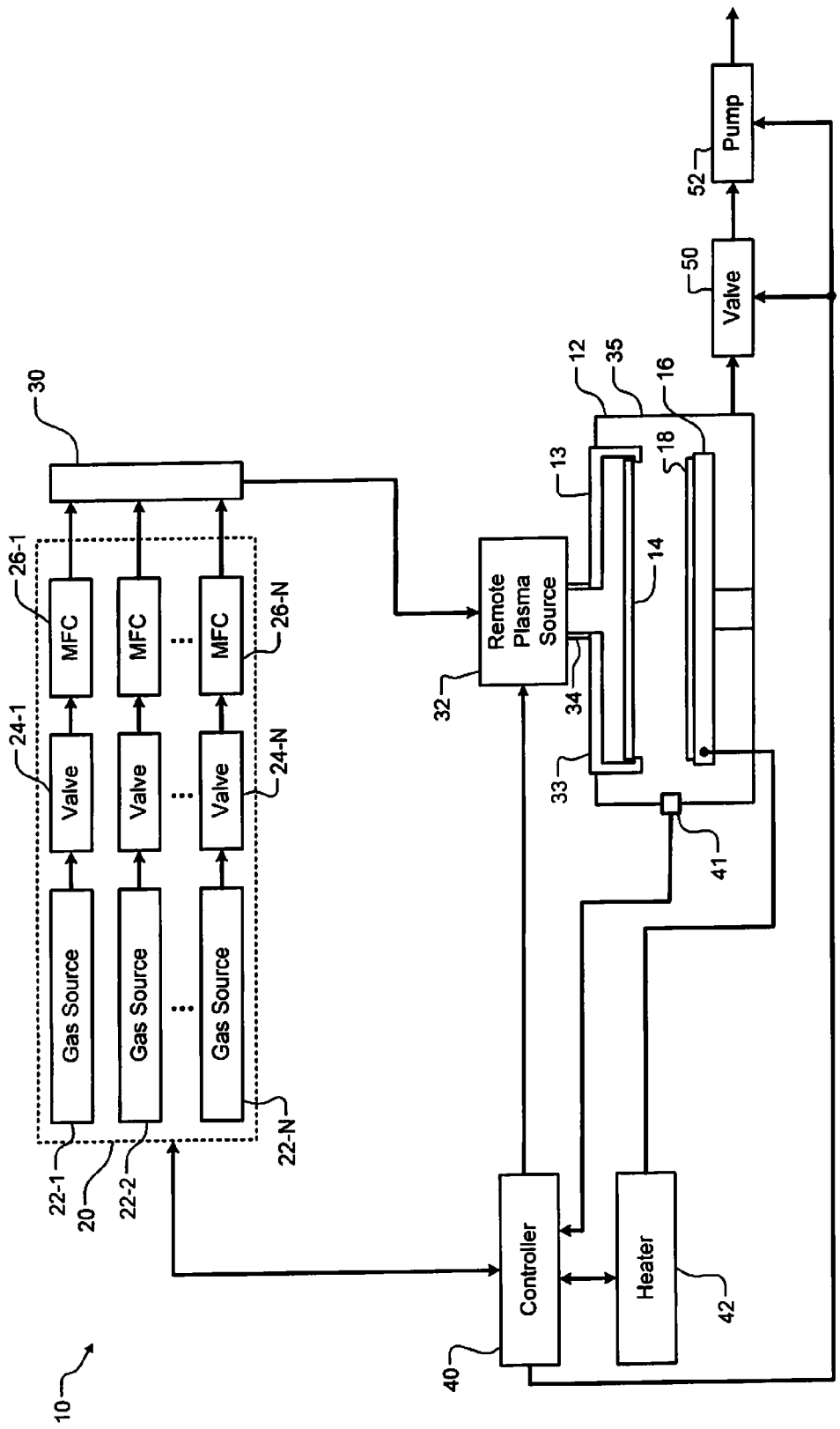
FIG. 2 is a functional block diagram of another example of a substrate processing system that uses forming gas and has reduced copper contamination according to the present disclosure.
Figure 3:
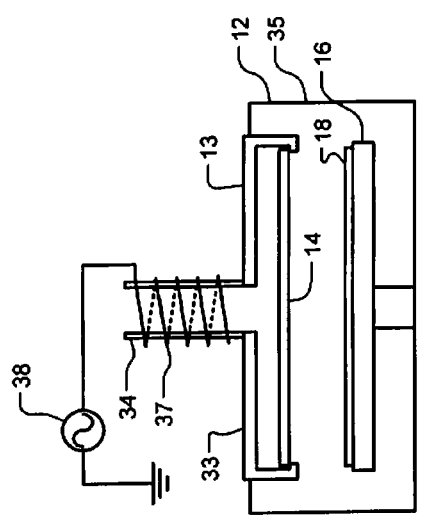
FIG. 3 is a functional block diagram of an example of remote plasma source.

Referring now to FIGS. 2 and 3, an example of a substrate processing system 10 is shown. In FIG. 2, the substrate processing system 10 includes a processing chamber 12 and a gas distribution device 13 such as a showerhead 14. A substrate support 16 may be arranged in the process chamber 12. During use, a substrate 18 such as a semiconductor wafer or other type of substrate may be arranged on the substrate support 16. During conditioning, dummy substrates may be used to protect the substrate support 16.

The substrate processing system 10 includes a gas delivery system 20 to supply process gas and/or purge gas. For example only, the gas delivery system 20 may include one or more gas sources 22-1, 22-2, . . . , and 22-N (collectively gas sources 22) where N is an integer greater than zero, valves 24-1, 24-2, . . . , and 24-N (collectively valves 24), and mass flow controllers (MFC) 26-1, 26-2, . . . , and 26-N (collectively MFC 26).

Outputs of the gas delivery system 20 may be mixed in a manifold 30 and delivered to a remote plasma source 32 and/or directly to the gas distribution device 13. In some examples, the showerhead 14 includes a base portion 33 and a stem portion 34 connected to the base portion 33. The base portion 33 extends radially outwardly from the stem portion 34. The base portion 33 may extend towards opposite sidewalls 35 of the processing chamber 12. In FIG. 3, the remote plasma source 32 may include an inductive coil 37 arranged around the stem portion 34. A radio frequency (RF) or microwave (MW) source 38 selectively supplies RF or MW power to the inductive coil 37. A matching network (not shown) may be used between the source 38 and the inductive coil 37.

A controller 40 in FIG. 2 may be connected to one or more sensors 41 that monitor operating parameters in the processing chamber 12 such as chamber temperature, pressure, etc. A heater 42 may be provided to heat the substrate support 16 and the substrate 18 as needed. A valve 50 and pump 52 may be provided to evacuate gas from the processing chamber 12. The controller 40 may be used to control the gas delivery system 20, the heater 42, the valve 50, the pump 52, and plasma generated by the remote plasma source 32.

Figure 4:
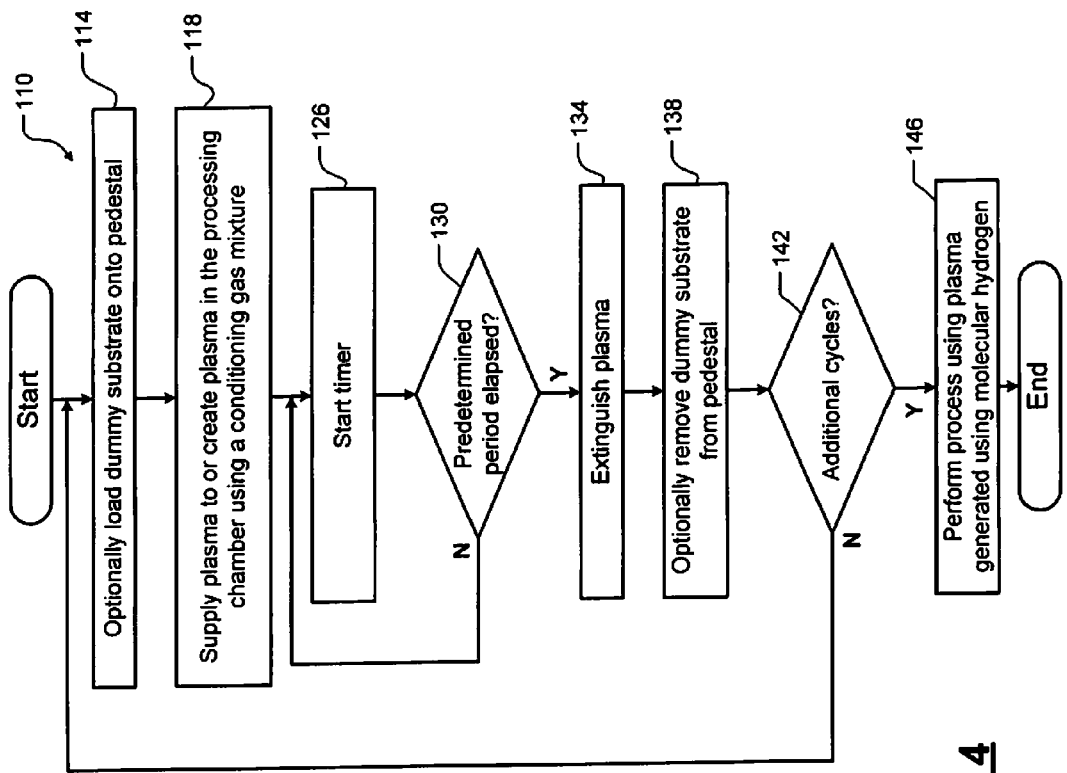
FIG. 4 is a flowchart illustrating steps of a method for reducing copper contamination in a plasma processing chamber.

Referring now to FIG. 4, a method 110 for conditioning a processing chamber to reduce copper contamination is shown. The processing chamber includes one or more components that are made from alloys that include copper. In some examples, the components are made from an aluminum alloy that includes copper. In other examples, the aluminum alloy includes 6061 aluminum alloy. At 114, a dummy substrate is optionally loaded onto the substrate support. The dummy substrates may be used to protect the substrate support during plasma conditioning. At 118, the method supplies plasma to or creates plasma in the chamber using a conditioning gas mixture including molecular oxygen and forming gas. At 126, a timer is started. At 130, the method determines whether a predetermined period has elapsed. When the predetermined period has elapsed as determined at 130, the plasma is extinguished at 134. If used, the dummy substrate may be removed from the processing chamber (or the dummy substrate may remain in the processing chamber). At 142, the method determines whether additional cycles will be performed. If additional cycles will be performed as determined at 142, the method returns to 114. Otherwise, the method continues at 146 and a plasma-based process using hydrogen-based plasma such as forming gas may be performed in the processing chamber with reduced copper contamination.

In some examples, a predetermined number of RF hours (RFH) are performed during the conditioning process. RFH corresponds to a sum of plasma ON periods during conditioning and does not include periods when the plasma is off such as when dummy substrates are loaded and unloaded from the processing chamber. For example only, the RFH may be set to a range from 2 RFH to 20 RFH, although other RFH ranges may be used. For example only, the RFH may be set equal to 10 and each cycle time may be equal to 120 seconds or 2 minutes. In this example, the plasma would be cycled 300 times (600 minutes/2 minutes per plasma ON cycle). In some examples, a cassette or front opening unified pod (FOUP) may be used to deliver the dummy substrates to the substrate processing tool.

In some examples, the conditioning process uses process parameters (duration, power and number of plasma cycles) that are similar to the plasma process using hydrogen-based plasma such as forming gas that will be subsequently employed with the substrates. For example only, the conditioning process RF ON time may be between 80% to 120% of the RF ON time of the plasma process. Likewise, the number of RF ON cycles may approximately correspond to the number of plasma cycles to be used in the plasma process. For example only, the conditioning plasma process may include N processing cycles and the plasma process may include M processing cycles. In some examples, N is between 80% to 120% of M.

During the conditioning process, copper is released from exterior surfaces of the processing chamber components that are made from alloys including copper. The copper turn into volatile copper hydride (CuH) and removed by gas flow. In some examples, the alloy includes aluminum alloy. In some examples, the aluminum alloy includes 6061 aluminum alloy, although other aluminum alloys including aluminum and copper can be used.

In some examples, the copper contamination level is reduced from 2 to 16 e10/cm$^2$ to less than 1 e10/cm$^2$ after the conditioning process, which is at least a 10-fold reduction in copper contamination.

In one example process, the process temperature was set to 285° C., process pressure was set to 1.5 Torr, RFH was set to 10, RF power was set to 4500 W, and RF plasma time was set to 120 seconds, although other process parameters may be used. In this example, molecular oxygen was supplied at 6000 sccm and forming gas was supplied at 4000 sccm, although other flow rates may be used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their process before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and process settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control process, enable cleaning process, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining process parameters for carrying out a particular process on or for a semiconductor wafer or to a system. The process parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication process, examine a history of past fabrication process, examine trends or performance metrics from a plurality of fabrication process, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more process. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for reducing copper contamination in a substrate processing system, comprising:
    performing a plasma process on a substrate in a processing chamber of a substrate processing system,
    wherein a component located in the processing chamber is made of an alloy including copper,
    wherein the plasma process uses a process gas mixture including molecular hydrogen; and
    prior to performing the plasma process on the substrate and before the substrate is arranged in the processing chamber, conditioning the component in the processing chamber using a conditioning plasma process that includes a process gas mixture including molecular oxygen and forming gas.

2. The method of claim 1, wherein the alloy includes aluminum.

3. The method of claim 1, wherein the alloy comprises 6061 aluminum alloy.

4. The method of claim 1, wherein the process gas mixture includes forming gas.

5. The method of claim 4, wherein the forming gas includes 4% molecular hydrogen and 96% molecular nitrogen.

6. The method of claim 1, further comprising arranging a dummy substrate on a substrate support in the processing chamber during the conditioning plasma process.

7. The method of claim 1, wherein the substrate includes a semiconductor wafer.

8. The method of claim 1, wherein the plasma process includes a photoresist strip process.

9. The method of claim 1, wherein copper contamination in the processing chamber before the conditioning plasma process as compared to copper contamination after the conditioning plasma process is reduced by a factor of 10.

10. The method of claim 1, wherein the conditioning plasma process includes N plasma processing cycles each including a plasma ON time, and wherein N is an integer greater than one.

11. A substrate processing system, comprising:
    a processing chamber;
    a component located in the processing chamber that is made of an alloy including copper;
    a plasma generator configured to generate plasma in the processing chamber;
    a gas delivery system configured to selectively deliver forming gas, molecular oxygen and/or molecular hydrogen to the processing chamber; and
    a controller that communicates with the gas delivery system and the plasma generator, and that is configured to:
        prior to performing a plasma process on a substrate in the processing chamber using a process gas mixture including molecular hydrogen and before the substrate is arranged in the processing chamber, condition the component in the processing chamber using a conditioning plasma process that includes a process gas mixture including the molecular oxygen and the forming gas; and
        perform the plasma process on the substrate.

12. The substrate processing system of claim 11, wherein the alloy includes aluminum.

13. The substrate processing system of claim 11, wherein the alloy comprises 6061 aluminum alloy.

14. The substrate processing system of claim 11, wherein the process gas mixture includes forming gas.

15. The substrate processing system of claim 14, wherein the forming gas includes 4% molecular hydrogen and 96% molecular nitrogen.

16. The substrate processing system of claim 11, wherein the controller is configured to arrange a dummy substrate on a substrate support in the processing chamber during the conditioning plasma process.

17. The substrate processing system of claim 11, wherein the substrate includes a semiconductor wafer.

18. The substrate processing system of claim 11, wherein the plasma process includes a photoresist strip process.

19. The substrate processing system of claim 11, wherein copper contamination in the processing chamber before the conditioning plasma process as compared to copper contamination after the conditioning plasma process is reduced by a factor of 10.

20. The substrate processing system of claim 11, wherein the conditioning plasma process includes N plasma processing cycles each including a plasma ON time, and wherein N is an integer greater than one.

* * * * *